(12) United States Patent
Tu et al.

(10) Patent No.: US 6,674,103 B2
(45) Date of Patent: Jan. 6, 2004

(54) HBT WITH NITROGEN-CONTAINING CURRENT BLOCKING BASE COLLECTOR INTERFACE AND METHOD FOR CURRENT BLOCKING

(75) Inventors: Charles W. Tu, La Jolla, CA (US); Peter M. Asbeck, San Diego, CA (US); Kazuhiro Mochizuki, Nagasaki (JP); Rebecca Welty, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 52 days.

(21) Appl. No.: 09/919,367

(22) Filed: Jul. 31, 2001

(65) Prior Publication Data

US 2002/0079511 A1 Jun. 27, 2002

Related U.S. Application Data

(60) Provisional application No. 60/221,939, filed on Jul. 31, 2000.

(51) Int. Cl.$^7$ .................................... H01L 31/0328
(52) U.S. Cl. ..................... 257/197; 257/183; 257/76
(58) Field of Search ............................. 257/197, 273, 257/370, 565, 198, 200, 191, 631, 76, 183

(56) References Cited

U.S. PATENT DOCUMENTS

| | | | | | |
|---|---|---|---|---|---|
| 4,511,912 | A | * | 4/1985 | Mahrla | 357/36 |
| 5,330,932 | A | * | 7/1994 | Liu et al. | 437/133 |
| 5,331,656 | A | * | 7/1994 | Tanaka | 372/45 |
| 5,432,356 | A | * | 7/1995 | Imamura | 257/24 |
| 5,631,495 | A | * | 5/1997 | Dunn et al. | 257/587 |
| 5,648,666 | A | * | 7/1997 | Tran et al. | 257/197 |
| 5,679,965 | A | * | 10/1997 | Schetzina | 257/103 |
| 5,682,046 | A | * | 10/1997 | Takahashi et al. | 257/198 |
| 5,734,183 | A | * | 3/1998 | Morishita | 157/197 |
| 5,976,948 | A | * | 11/1999 | Werner et al. | 438/424 |
| 6,271,098 | B1 | * | 8/2001 | Miyakuni et al. | 438/312 |
| 6,392,258 | B1 | * | 5/2002 | Hirata et al. | 257/197 |

FOREIGN PATENT DOCUMENTS

| | | | | | |
|---|---|---|---|---|---|
| JP | 2000223497 | * | 1/1999 | | H01L/21/331 |
| JP | 2001176882 | * | 12/1999 | | H01L/21/331 |

OTHER PUBLICATIONS

J. Xu and M. Shur, "A tunneling emitter bipolar transistor," *IEEE Electron Device Lett.*, vol. EDL–7, pp. 416–418, 1986.

T. Kobayashi, K. Taira, F. Nakanuma, and H. Kawai, "Band lineup for a GaInP/GaAs heterojunction measured by a high–gain Npn heterojunction bipolar transistor grown by metalorganic chemical vapor deposition," *J. Appl. Phys.*, vol. 65, pp. 4898–4902, 1989.

M.J. Hafich, J.H. Quigley, R.E. Owens, G.Y. Robinson, D. Li, and N. Otsuka, "High quality quantum wells of InGaP/GaAs grown by molecular beam epitaxy," *Appl. Phys. Lett.*, vol. 54, pp. 2686–2688, 1989.

(List continued on next page.)

*Primary Examiner*—Amir Zababian
*Assistant Examiner*—Monica Lewis
(74) *Attorney, Agent, or Firm*—Greer, Burns & Crain, Ltd.

(57) ABSTRACT

An improved HBT of the invention reduces the current blocking effect at the base-collector interface. Nitrogen is incorporated at the base-collector interface in an amount sufficient to reduce the conduction band energy of the collector at the base-collector interface to equal the conduction band energy of the base. In a preferred embodiment, a nitrogen concentration on the order of 2% is used in a thin ~20 nm layer at the base-collector interface. Preferred embodiment HBTs of the invention include both GaAs HBTs and InP transistors in various layer structures, e.g., single and double heterojunction bipolar transistors and blocked hole bipolar transistors.

9 Claims, 3 Drawing Sheets

OTHER PUBLICATIONS

J. Chen, J.R. Sites, I.L. Spain, M.J. Hafich, and G.Y. Robinson, "Band offset of GaAs/In$_{0.48}$ Ga$_{0.52}$ P measured under hydrostatic pressure," *Appl. Phys. Lett.*, vol. 58, pp. 744–746, 1991.

M.A. Hasse, M.J. Hafich, and G.Y. Robinson, "Internal photoemission and energy–band offsets in GaAs–GaInP p–I–N heterojunction photodiodes," *Appl. Phys. Lett.*, vol. 58, pp. 616–618, 1991.

S.S. Lu and C.C. Wu, "High–current–gain small–offset–voltage In$_{0.49}$ Ga$_{0.51}$ P/GaAs tunneling emitter bipolar transistors grown by gas source molecular beam epitaxy," *IEEE Electron Device Lett.*, vol. 13, pp. 468–470, 1992.

C.C. Wu and S.S. Lu, "Small offset–voltage In$_{0.49}$ Ga$_{0.51}$ P/GaAs double–barrier bipolar transistor," *IEEE Electron Device Lett.*, vol. 13, pp. 418–420, 1992.

T.W. Lee, P.A. Houston, R. Kumar, G. Hill, and M. Hopkinson, "Asymetric characteristics of InGaP/GaAs double–heterojunction bipolar transistors grown by solid source molecular beam epitaxy," *Semicond. Sci. Technol.*, vol. 7, pp. 425–428, 1992.

K. Mochizuki, T. Tanoue, T. Oka, K. Ouchi, K. Hirata, and T. Nakamura, "High–speed InGaP/GaAs transistors with a sidewall base contact structure," *IEEE Electron Device Lett.*, vol. 18, pp. 562–564, 1997.

M. Mesrine, J. Massies, E. Vanelle, N. Grandjean, and C. Deparis, "Photoluminescence energy and interface chemistry of GaInP/GaAs Quantum wells," *Appl. Phys. Lett.*, vol. 71, pp. 3552–3554, 1997.

E. Vanelle, M. Mesrine, N. Grandjean, C. Deparis, and J. Massies, "Interface effects on the photoluminescence of GaAs/GaInP quantum wells," *Jpn. J. Appl. Phys.*, vol. 37, pp. 15–22, 1998.

K. Mochizuki, H. Masuda, M. Kawata, K. Mitani, and C. Kusano, "Observation of the surface recombination current with an ideality factor of unity in AlGaAs/GaAs heterojunction bipolar transistors," *Jpn. J. Appl. Phys.*, vol. 30, pp. L266–L268, 1991.

C.H. Henry, R.A. Logan, and F.R. Meritt, "The effect of surface recombination on current in Al$_x$Ga$_{1-x}$AS heterojunctions," *J. Appl. Phys.*, vol. 49, pp. 3530–3542, 1978.

O. Nakajima, K. Nagata, H. Ito, T. Ishibashi, and T. Sugeta, "Emitter–base junction size effect on current gain H$_{fe}$ of AlGaAs/GaAs heterojunction bipolar transistors," *Jpn. J. Appl. Phys.*, vol. 24, pp. L596–L598, 1985.

K. Mochizuki, R.J. Welty and P.M. Asbeck, "GaInP/GaAs collector–up tunneling–collector heterojunction bipolar transistors with zero–offset and low–knee–voltage characteristics," *Electron. Lett.*, vol. 36, No. 3, pp. 264–265, 2000.

B.C. Lye, P.A. Houston, H.K. Yow and C.C. Botton, "GaInP/AlGaAs/GaInP double heterojunction bipolar transistors with zero conduction band spike at the collector," *IEEE Trans. Electron Devices*, vol. 45, No. 12, pp. 2417–2421, 1998.

N.Y. Li, P.C. Chang, A.G. Baca, X.M. Xie, P.R. Sharps and H.Q. Hou, "*DC characteristics of MOVPE–grown Npn InGaP/InGaAsN DHBTs*," Electron. Lett., vol. 36, No. 1, pp. 81–83, 2000.

R.J. Welty, Y.G. Hong, H.P. Xin, C.W. Tu, P.M. Asbeck, "Nitrogen Incorporation in GaInP for Novel Heterojunction Bipolar Transistors", 2000 IEEE, pp. 33–40.

Masahiko Kondow, Takeshi Kitani, Shinichi Nakatsuka, Michael C. Larson, Kouji Nakahara, Yoshiaki Yazawa, Makoto Okai, and Kazuhisa Uomi, "GaInNAs: A Novel Material for Long–Wavelength Semiconductor Lasers", IEEE Journal of Selected Topics in Quantum Electronics, vol. 3, No. 3, Jun. 1997, pp. 719–730.

Thomas Lauterbach, Wilfried Pletschen, and Karl Heinz Bachem, "GaAs Bipolar Transistors with a Ga0.5In0.5P Hole Barrier Layer and Carbon–Doped Base Grown by MOVPE", IEEE Transactions on Electron Devices, vol. 39, No. 4, Apr. 1992, pp. 753–756.

Yutaka Matsuoka, Shoji Yamahata, Satoshi Yamaguchi, Koichi Murata, Eijichi Sano, and Tadao Ishibashi, "IC–Oriented Self–Aligned High–Performance AlGaAs GaAs Ballistic Collection Transistors and Their Applications to High–Speed Ics", IEICE Trans. Electron, vol. E76–C, No. 9, Sep. 1993, pp. 1392–1400.

\* cited by examiner

HBT WITH NITROGEN-CONTAINING CURRENT BLOCKING BASE COLLECTOR INTERFACE AND METHOD FOR CURRENT BLOCKING

RELATED APPLICATIONS AND PRIORITY CLAIM

This application is related to prior provisional application serial No. 60/221,939 filed Jul. 31, 2000. This application claims priority from that provisional application under 35 U.S.C. §119.

STATEMENT OF GOVERNMENT INTEREST

This invention was made with United States government assistance through the Army Research Office, Grant MURI No. DAAH04-96-1-0005. The government has certain rights in this invention.

FIELD OF THE INVENTION

The field of the invention is Group III-V heterojunction bipolar transistors (HBTs). The invention is particularly useful in transistors having a gallium arsenide (GaAs) or indium phosphide (InP) substrate.

BACKGROUND OF THE INVENTION

For various performance reasons, some conventional HBTs use a collector layer with a wider bandgap than the bandgap of the base layer. The wide bandgap collector in an npn HBT blocks holes from entering the collector layer when the transistor saturates. This decreases saturation voltage of the transistor. The collector layer can harm performance, though, since the candidate materials used in the collector also tend to have a higher conduction band energy than that of the base layer. In that case, typical in HBTs having GaAs and InP substrates, the collector layer also partially blocks electron transport. This is evidenced by a small spike in the conduction band of the collector layer near the base-collector interface.

SUMMARY OF THE INVENTION

An improved HBT of the invention reduces the current blocking effect at the base-collector interface. Nitrogen is incorporated at the base-collector interface in an amount sufficient to reduce the conduction band energy of the collector at the base-collector interface to equal the conduction band energy of the base. In a preferred embodiment, a nitrogen concentration on the order of 2% is used in a thin ~20 nm barrier layer at the base-collector interface. Preferred embodiment HBTs of the invention include both GaAs HBTs and InP transistors in various layer structures, e.g., single and double heterojunction bipolar transistors and blocked hole bipolar transistors.

DETAILED DESCRIPTION OF THE PREFERRED EMBODIMENTS

Broadly, the invention concerns the incorporation of Nitrogen at the base-collector interface of an HBT to reduce the conduction band energy level of the collector layer to that of the base layer. The nitrogen is incorporated in small amounts. It may be in the collector layer, or in a particularly preferred embodiment as part of a thin barrier layer at the base-collector interface. Artisans will recognize that the invention is not limited to a particular HBT structure. Thus, while example structures and layer arrangements are discussed herein, the broader aspects of the invention are not limited thereto.

Figure 1:
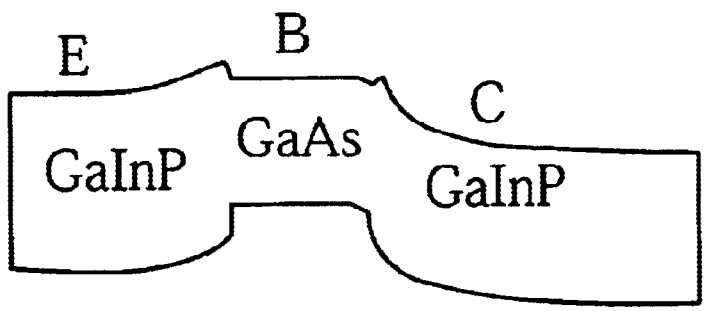
FIG. 1 is an energy band diagram for a conventional HBT having a wide bandgap collector layer of GaInP and a spike in the conduction band of the collector layer at the base-collector interface.

FIG. 1 shows the energy band diagram of a conventional HBT having a GaAs substrate and an emitter of AlGaAs or GaInP, a base of GaAs and a collector of GaInP or AlGaAs. In FIG. 1 and the other figures, the conventional format is adopted with the top line showing the conduction band and the bottom line showing the valence band. The collector material blocks flow of holes from the base to the collector. However, a conduction band barrier is also revealed in FIG. 1 in the form of a spike in the conduction band of the collector at the base-collector interface. This barrier results from the conduction band offset voltage between the base and collector materials. It partially blocks electron flow to the collector, particularly when the base-collector junction is forward biased.

Figure 2:
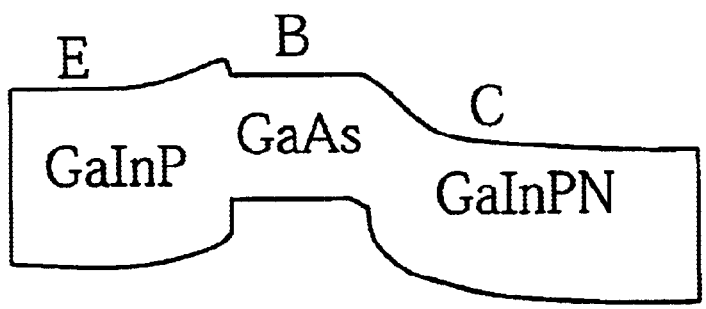
FIG. 2 is an energy band diagram for a preferred embodiment HBT having a wide bandgap collector layer of GaInPN, where N has been incorporated in a small percentage to smooth the conduction band at the base-collector interface.

FIG. 2 shows the band diagram of a modified HBT of the invention having Nitrogen incorporated into the collector layer, and thus, also in an area of the collector layer at the base-collector interface. The collector layer is GaInP or AlGaAs and includes nitrogen in an amount to lower the conduction band of the collector layer to that of the base layer. The appropriate amount of nitrogen makes the conduction band energy of the collector layer coincide with that of the base layer, eliminating the spike in the conduction band of the collector at the base-collector interface. This reduces or eliminates blocking of electrons by the collector layer. In contrast, hole flow from the p-type base to the collector is impeded by the large valence band barrier. Accordingly, the addition of Nitrogen in an appropriate amount does not impede the blockage of holes that tend to reduce the transistor's saturation, or "offset", voltage. Hole blockage also reduces the saturation charge storage when the base-collector junction is forward biased.

Figure 4:
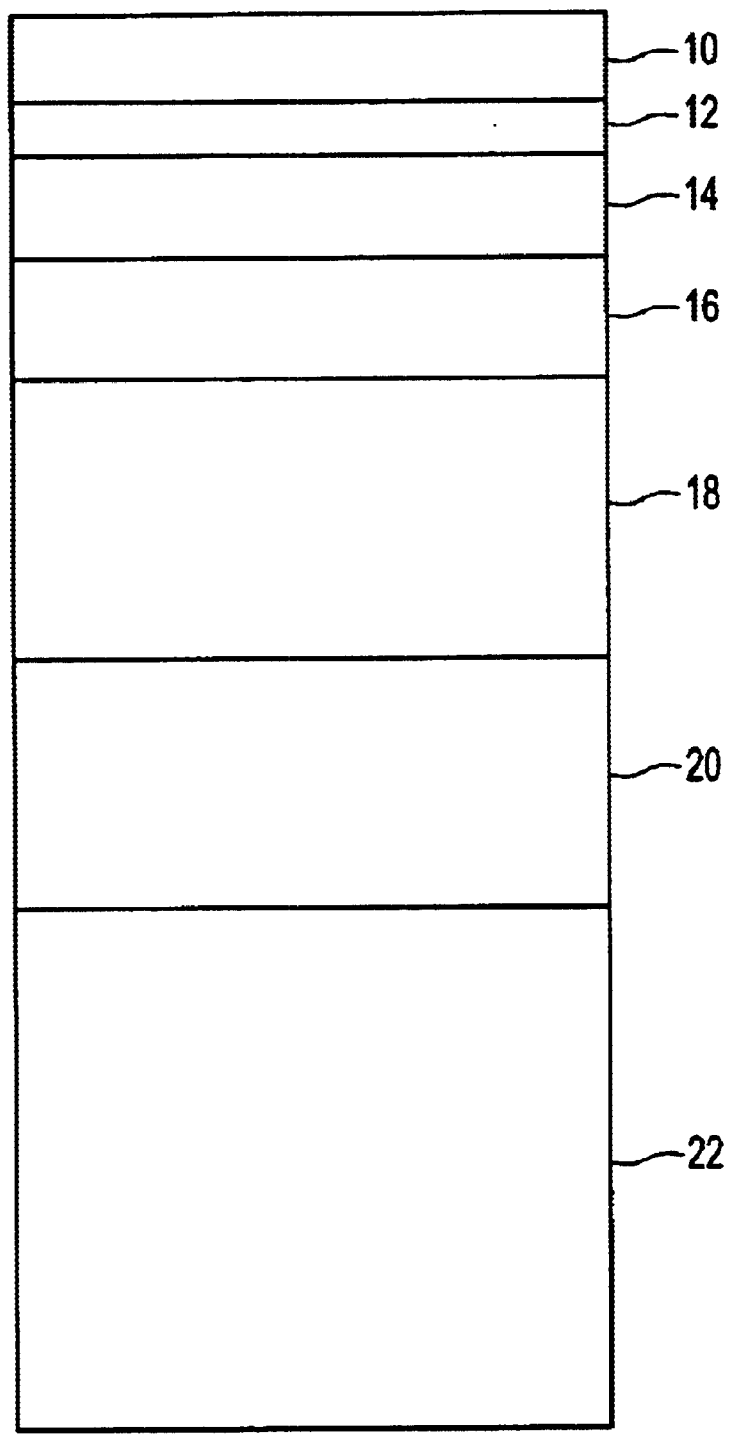
FIG. 4 is a schematic diagram of the layer stack of a preferred embodiment HBT of the invention.

A first example HBT is shown in FIG. 4, and includes the following layer structure.

Figure 3:
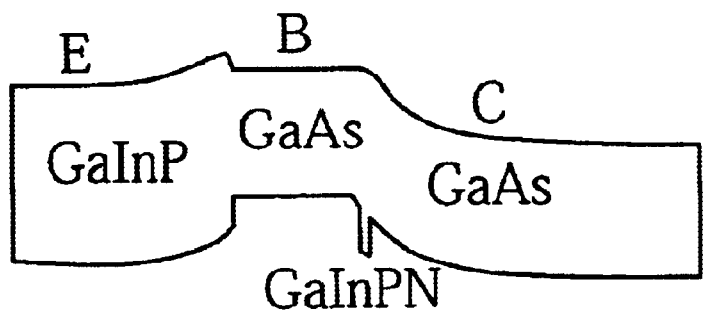
FIG. 3 is an energy band diagram for a preferred embodiment HBT having a wide bandgap collector layer of GaAs with a barrier layer of GaInPN at the base-collector interface to smooth the conduction band at the base-collector interface.

FIG. 3 represents a preferred embodiment in which nitrogen is incorporated in a thin barrier layer at the base-collector interface. The thin barrier layer may be functionally considered as part of the collector layer. A similar effect would be obtained by having nitrogen incorporated in a small area of the collector layer near the base-collector interface. The barrier layer is thick enough to block holes, but thin to minimize the extent to which electrons must flow in nitrogen containing material. Use of a thin barrier layer compares favorably to the FIG. 2 embodiment in that nitrogen tends to reduce electron mobility and saturation velocity, but similarly eliminates the spike in the conduction band at the base-collector interface. Nitrogen may also cause recombination and trapping. The thin nitrogen barrier layer allows the collector layer to perform better. An example layer of about 20 nm represents a preferred embodiment in the following example layer structures for HBTs of the present invention.

| First Example Layer Structure for HBT with GaInPN Collector | | | |
|---|---|---|---|
| Cap (10) | 300A | InGaAs | 1e19cm-3 |
| Emitter1 (12) | 100A | GaAs | 5e18cm-3 |
| Emitter2 (14) | 400A | GaInP | 3e17cm-3 |
| Base (16) | 600A | GaAs | 3e19cm-3 |
| Collector (18) | 4000A | GaInPN | 3e16cm-3 |
| Subcollector (20) | 7000A | GaAs | 5e18cm-3 |
| Substrate (22) | | GaAs | semi-insulating |

Figure 5:
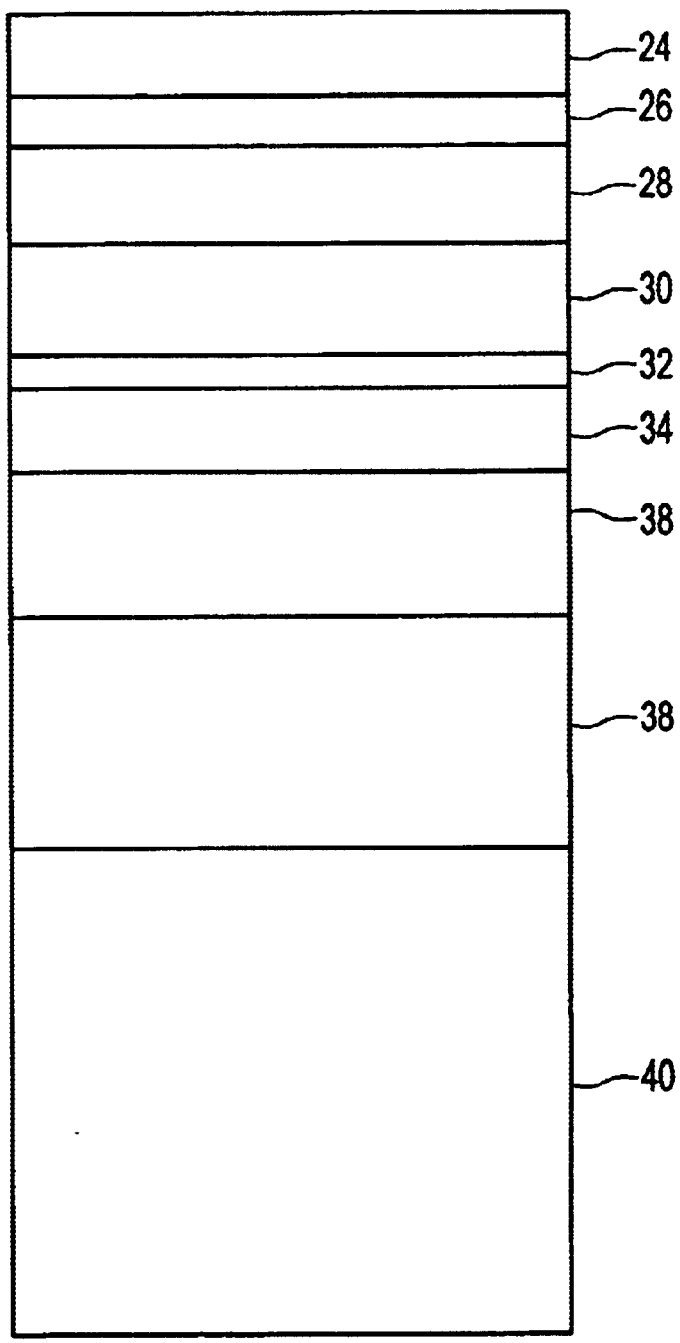
FIG. 5 is a schematic diagram of the layer stack an alternate preferred embodiment HBT of the invention.

A second example HBT is shown in FIG. 5, and includes the following layers.

| Second Example Layer Structure for HBT with GaInPN Thin Barrier Layer | | | |
|---|---|---|---|
| Cap (24) | 300A | InGaAs | 1e19cm-3 |
| Emitter1 (26) | 100A | GaAs | 5e18cm-3 |
| Emitter2 (28) | 400A | GaInP | 3e17cm-3 |
| Base (30) | 600A | GaAs | 3e19cm-3 |
| Setback (32) | 50A | GaAs | undoped |
| Barrier (34) | 200A | GaInPN | 3e16cm-3 |
| Collector (36) | 4000A | GaAs | 3e16cm-3 |
| Subcollector (38) | 7000A | GaAs | 5e18cm-3 |
| Substrate (40) | | GaAs | semi-insulating |

Generally, the incorporation of small amounts of nitrogen into material at the base-collector interface drastically reduces the bandgap of the collector material, with the majority of change affecting the conduction band. As an additional example, the incorporation of small amounts of nitrogen into GaInAs reduces the net strain of the material when grown on GaAs, which is the limiting factor for HBTs with GaInAs-bases. GaInAsN can be lattice matched to GaAs with up to roughly three times the amount of In as N. It is also known that GaInP can be lattice-matched to GaAs with Ga and In concentrations in roughly equal amounts. When N is added to GaInP, lattice-match to GaAs can be maintained when the In concentration is increased by roughly three times the amount of added nitrogen. Thus, the incorporation of nitrogen at a base-collector interface in practice of the invention will therefore not introduce fabrication problems due to lattice-mismatch.

The mentioned examples, which demonstrate but do not limit the invention, were grown by gas-source molecular beam epitaxy and the nitrogen was generated with a radio-frequency plasma source. Other alternative crystal growth methods are well-known for these materials, including metallorganic vapor phase epitaxy (MOVPE). Photoluminescence of epilayers indicated bandgap reduction for GaInPN layers that were grown. For 0.5% N there is a reduction in bandgap energy of the order of several hundreds of meV. Bandgap decreases quickly with small amounts of nitrogen, and the majority of the change in bandgap occurs in the conduction band, which is the same behavior that nitrogen incorporation has in GaInAs when used in other contexts. This behavior is beneficial in order for layers of GaInPN inserted between GaAs layers at the base-collector junctions of HBTs, to reduce the barriers to electron current flow, while not simultaneously reducing the blocking characteristics for holes While specific embodiments of the present invention have been shown and described, it should be understood that other modifications, substitutions and alternatives are apparent to one of ordinary skill in the art. Examples of such modifications might, for example, include grading the composition of the layers, or incorporation of dopants to form an electrostatic dipole. Such modifications, substitutions and alternatives can be made without departing from the spirit and scope of the invention, which should be determined from the appended claims.

Various features of the invention are set forth in the appended claims.

What is claimed is:

1. A group III-V heterojunction bipolar transistor, comprising:
   collector, base, and emitter layers formed on a substrate in an arrangement defining a base-collector interface;
   base material forming said base layer;
   collector material forming said collector layer and having a wider bandgap than said base material; and
   nitrogen incorporated at the base-collector interface outside of the base layer in an amount sufficient to reduce a conduction band energy of said collector layer at the base-collector interface to a conduction band energy of said base layer.

2. A group III-V heterojunction bipolar transistor, comprising:
   collector, base, and emitter layers formed on a substrate in an arrangement defining a base-collector interface;
   base material forming said base layer;
   collector material forming said collector layer and having a wider bandgap than said base material; and
   nitrogen incorporated at the base-collector interface in an amount sufficient to reduce a conduction band energy of said collector layer at the base-collector interface to a conduction band energy of said base layer; and
   wherein said nitrogen is incorporated in said collector layer.

3. The transistor of claim 1, further comprising a thin barrier layer between said base and collector layers, wherein said nitrogen is incorporated in said thin barrier layer.

4. The transistor of claim 3, wherein said thin barrier layer is ~20 nm.

5. A group III-V heterojunction bipolar transistor, comprising:
   collector, base, and emitter layers formed on a substrate in an arrangement defining a base-collector interface;
   base material forming said base layer;
   collector material forming said collector layer and having a wider bandgap than said base material; and
   nitrogen incorporated at the base-collector interface in an amount sufficient to reduce a conduction band energy of said collector layer at the base-collector interface to a conduction band energy of said base layer; and
   wherein said nitrogen is incorporated in a concentration on the order of 2%.

6. A group III-V heterojunction bipolar transistor, comprising:
   collector, base, and emitter layers formed on a substrate in an arrangement defining a base-collector interface;
   base material forming said base layer;
   collector material forming said collector layer and having a wider bandgap than said base material; and
   nitrogen incorporated at the base-collector interface in an amount sufficient to reduce a conduction band energy of said collector layer at the base-collector interface to a conduction band energy of said base layer; and wherein said base and emitter layers comprise GaAs, and said collector layer comprises GaInPN having said nitrogen incorporation in said collector layer.

7. The transistor according to claim 1, further comprising a barrier layer, wherein said base and emitter layers comprise GaAs, and said collector layer comprises GaInP, and said barrier layer comprises GaInPN having said nitrogen incorporation in said barrier layer.

8. A Group III-V heterojunction bipolar transistor defining a base-collector interface between a base layer and a collector layer, the transistor comprising a nitrogen containing barrier layer at the base-collector interface between the base layer and the collector layer to block holes without substantially affecting current flow by lowering the conduction band energy of the collector layer to coincide with the conduction band energy of the base layer.

9. A Group III-V heterojunction bipolar transistor defining a base-collector interface between a base layer and a collector layer, the transistor comprising nitrogen incorporated in an area of the collector layer at the base-collector interface between the base layer and the collector layer to block holes without substantially affecting current flow by lowering the conduction band energy of the collector layer to coincide with the conduction band energy of the base layer.

* * * * *